United States Patent [19]

Fujiwara et al.

[11] Patent Number: 4,798,435
[45] Date of Patent: Jan. 17, 1989

[54] OPTICAL SWITCH CIRCUIT

[75] Inventors: Masahiko Fujiwara; Akira Ajisawa; Shuji Suzuki, all of Tokyo, Japan

[73] Assignee: NEC Corporation, Tokyo, Japan

[21] Appl. No.: 734,725

[22] Filed: May 16, 1985

[30] Foreign Application Priority Data

May 17, 1984 [JP] Japan ................................ 59-99120
Jun. 22, 1984 [JP] Japan ............................... 59-128715
Apr. 5, 1985 [JP] Japan ................................ 60-72153
Apr. 10, 1985 [JP] Japan ................................ 60-76304

[51] Int. Cl.$^4$ .............................................. G02B 6/10
[52] U.S. Cl. ................................. 350/96.13; 350/96.14
[58] Field of Search ............... 350/96.13, 96.14, 96.15, 350/96.16, 96.19, 96.20; 455/600, 612; 370/1, 53

[56] References Cited

U.S. PATENT DOCUMENTS

| 3,871,743 | 3/1975 | Fulenwider | 455/600 |
| 4,011,543 | 3/1977 | Soref et al. | 350/96.13 |
| 4,153,329 | 5/1979 | Gillette | 350/96.13 |
| 4,528,695 | 7/1985 | Khoe | 455/612 |
| 4,653,850 | 3/1987 | Boirat et al. | 350/96.20 |

OTHER PUBLICATIONS

"Waveguide Electrooptic Modulators", by R. C. Alferness, IEEE Transactions on Microwave Theory and Techniques, vol. MTT-30, No. 8, Aug. 1982.
"Spatial Light Modulators", by David Casasent, Proceedings of the IEEE, vol. 65, No. 1, Jan. 1979, pp. 143-157.
"Switching Characterristics of Laser Diode Switch", by Masahiro Ikeda, IEEE Journal of Quantum Electronics, vol. QE-19, No. 2, Feb. 1983, pp. 157-164.
"A Monolithically Integrated Optical Repeater", by M. Yust et al., Appl. Phys. Lett. 35(10), 15 No. 1977, pp. 795-797.
Japanese Patent Laid-Open Specification No. sho58-97994.
"17-GHz Bandwidth Electro-Optic Modulator", by C. M. Gee et al., Appl. Phys. Lett. 43(11), 1 Dec. 1983, pp. 998-1000.
"Extinction Retio Limitations in GaAlAs Electroabsorption Light Modulators": by J. C. Dyment et al., Journal of Applied Physics, vol. 47, No. 4, Apr. 1976, pp. 1523-1528.

Primary Examiner—William L. Sikes
Assistant Examiner—Robert E. Wise
Attorney, Agent, or Firm—Sughrue, Mion, Zinn, Macpeak & Seas

[57] ABSTRACT

An optical switch circuit is configured as a matrix array to arbitrarily switch the connections between optical transmission channels. The optical switch circit comprises a plurality of optical splitter coupled to input transmission channels, a plurality of optical switches arranged on the matrix crosspoints, each switch comprising an optoelectronic element and a light modulating element functioning as an electrooptic element, and a plurality of optical combiners coupled to output transmission channels. Thus, a small-sized optical switch circuit suitable for integration is realized. With this circuit, small crosstalk and high speed switching without distortion of broadband signals are expected. Further, this circuit provides a wide adaptability such that light transmitted through multi-mode optical fiber can be switched.

17 Claims, 7 Drawing Sheets

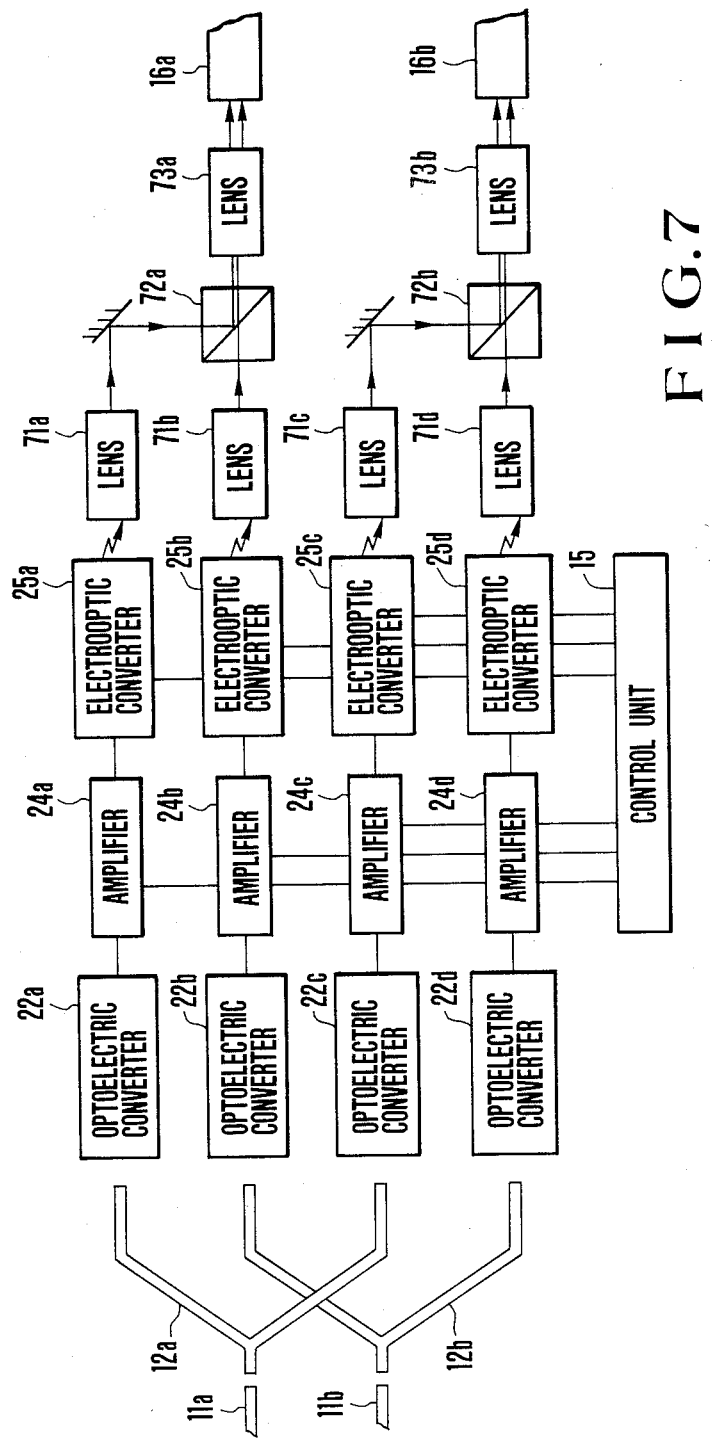
F I G. 7

OPTICAL SWITCH CIRCUIT

BACKGROUND OF THE INVENTION

The present invention relates to an optical switch circuit for arbitrarily switching the connections between optical transmission paths of multichannel configuration. Specifically, the present invention is concerned with an optical matrix switch circuit in which a plurality of optical switches, each comprising an optoelectronic element and a light modulating element functioning as an electrooptic element, are arranged on the matrix crosspoints.

The substantial realization of recent optical communication systems offers a new concept of the system providing novel functions or services which have not been practiced in the prior art. By way of example, for a device required for such a system, there is an optical switch circuit which switches at a high speed the connections between a large number of optical transmission channels. In the prior art, the optical switch circuit of this kind has typically employed a mechanical switch in which a movable optical element such as prism or lens in the optical transmission channel itself is movably provided. However, by taking into account requirements, e.g., high switching speed, reliability of operation and multichannel scheme etc., it is expected in the future that non-mechanical switch circuits which can be integrated, will be substituted for such a mechanical switch.

As one example of such a non-mechanical switch, there is known an optical switch circuit of an optical splitter-optical gate type as shown in Japanese Patent Application Laid-open No. 97994/83. The configuration and the operation of the optical splitter-optical gate type optical switch circuit mentioned above will be described.

FIG. 4 is a schematic illustration of the operation of the optical splitter-optical gate type optical switch circuit, wherein a two-input, two-output circuit is shown for facilitating the description. Light signals transmitted via input optical transmission channels 11a and 11b are split by optical splitters 12a and 12b, respectively. Split light signals from the optical splitter 12a are inputted to optical gate switches 13a and 13b, respectively. Likewise, split light signals from the optical splitter 12b are inputted to optical gate switches 13c and 13d, respectively. The optical gate switch is defined as a light modulator type switch which turns on or off the passage of a light signal in accordance with a control signal. For example, when the optical gate switch is in an on-state, it allows a light signal to pass therethrough, while when in an off-state, it allows the light signal to be blocked. In this example, a waveguide path at the output is configured as an optical combiner. The light signal which has passed through the optical gate switch 13a or 13c travels via an optical combiner 14a, and then the combined optical signal is outputted as output light 40a. Likewise, the light signal which has passed through the optical gate switch 13b or 13d travels via an optical combiner 14b, and then the combined optical signal is outputted as output light 40b.

Further understanding of the prior art may be obtained from an example of the circuit connection status when a light signal from the input light transmission channel 11a and a light signal from the input light transmission channel 11b are outputted as the light outputs 40b and 40a, respectively. To establish the above-mentioned connection, it is sufficient that the optical gate switches 13a, and 13d are in off-state an and the optical gate switches 13b and 13c are in on-state an. Other arbitrary connections may be realized by combining the on/off states of the optical gate switches 13a, 13b, 13c and 13d.

The optical switch circuit of the structure stated above effects switching operation for a light signal. Accordingly, this circuit is advantageous in that the bandwidth and the quality of a transmission signal are not degraded and problems due to electromagnetic induction and crosstalk etc. do not occur, as compared to a method in which a light signal is converted once into an electric signal thereafter to effect switching. Further, when compared to a switch which switches light paths of a usual waveguide type (e.g. a directional coupler type optical switch based on electro-optical effect), the above-mentioned optical gate switch can be small-sized, thus providing adaptability to multichannel purpose.

However, the optical switch circuit of this type has the drawbacks stated below. The optical splitter-optical gate type switch circuit is configured so as to optically combine output light flows from optical gate switches. For this reason, it is likely that signal light which has failed to be sufficiently extinguished when an optical gate switch is turned off is mixed into the combined output light as a crosstalk component. As the number of transmission channels increases to a great extent, the occurrence of such an undesirable phenomenon also increases accordingly. Therefore, the optical gate switch is required to have a large extinction ratio rather than small size and high speed requirements. Conventional optical gate switches are described in the following articles: (i) a waveguide type switch utilizing electro-optical effect (e.g. Applied Physics Letters vol. 43, p. 998, 1983); (ii) an absorption type light modulator based on Franz-Keldysh effect (e.g. Journal of Applied Physics vol. 47, p. 1523, 1976); (iii) an optical shutter using liquid crystal or ferroelectric crystal (e.g. Proceedings of IEEE vol. 65, p. 143, 1977); and (iv) a device modulating gain and loss by carrier injection into semiconductor (IEEE Journal of Quantum Electronics. vol. QE-19, p. 157, 1983).

The extinction ratio experimentarily confirmed with the above articles (i) to (iii) is approximately 20 to 30 dB, which is unsatisfactory to the requirement for the optical gate switch. On the other hand, with a switch to control current injection into a semiconductor laser, a so-called semiconductor laser diode switch, described in the article (iv), the extinction ratio of 60 to 70 dB can be obtained. However, since this switch utilizes gain mechanism of the semiconductor laser, its characteristics are dependent upon the mode and the wavelength of incident light, and are not adaptable to the switching of light transmitted through multi-mode optical fiber.

As stated above, an optical gate switch acceptable from a practical point of view has not been realized in the prior art, thus failing to make good use of an excellent feature of the optical splitter-optical gate type switch circuit.

SUMMARY OF THE INVENTION

In view of the above, an object of this invention is to eliminate the above-mentioned drawbacks encountered in conventional optical switch circuits.

Another object of the present invention is to provide a small-sized optical switch circuit suitable for integration.

A further object of the present invention is to provide an optical switch circuit having small crosstalk and capable of switching at a high speed without causing broadband signals to be distorted.

A still further object of the present invention is to provide an optical switch circuit for multichannel having a wide adaptability such that light transmitted through multi-mode optical fiber can be also switched.

According to the present invention, there is provided an optical switch circuit configured as a matrix having (m×n) crosspoints where m denotes the number of input optical channels and n denotes the number of output optical channels (m and n being a positive integer), wherein when the coordinates of an arbitrary crosspoint are expressed as (i, j) (i=1, 2, ... m, j=1, 2, ... n), there are arranged on the (m×n) crosspoints, optoelectric means for converting an input light signal transmitted via each of the input optical channels into an electric signal, electric circuit means responsive to a control signal to output an electric signal corresponding to an output electric signal from the optoelectric means, and light modulating means responsive to the electric signal from the electric circuit means to produce a modulated light signal, and wherein the optical switch circuit comprises: first means for distributing each of the m number of input light signals to the n number of optoelectric means defined by fixing the i-component of the coordinates of the arbitrary crosspoint, and second means for optically combining each of light outputs from the m number of light modulating means defined by fixing the j-component of the coordinates of the arbitrary crosspoint.

The first means may be comprised of an optical splitter and the second means may be comprised of an optical combiner. The light modulating means may function as an electrooptic means. Thus, the optoelectric means, the electric circuit means and the light modulating means constitute an optical gate switch.

The optical gate switch may comprise a light-sensitive detector for detecting a light signal, a driver element coupled to the light-sensitive detector, and an electrooptic means driven by the driver element. Each of the light-sensitive detector and the driver element may be comprised of a metal semiconductor field-effect transistor and the electrooptic element may be comprised of a laser diode.

The optical gate switch may comprise in combination a photodiode, an avalanche photodiode, a phototransistor, a light emitting diode, and a bipolar transistor etc.

An optical switch circuit may comprise in combination: an m number of optical splitter (m is a positive integer) for splitting a light signal entering from one input terminal into an n number of light signals (n is an integer more than two); optical switch means optically cascade-connected to each output of the m number of optical splitters, the optical switch means including optoelectric means for converting the split light signals into electric signals, electrooptic means for converting the electric signals into light signals, and switch control means operative to effect a switch control for the optoelectric means and the electrooptic means, thus presenting a function to allow the split light signals from the m number of optical splitters to pass through the optical switch means in on-state and to prevent them from passing in off-state; and waveguide means cascade-connected to each of the optical switch means to allow the optical signals from the optical switch means to be outputted therefrom.

When the optical switch circuit is provided with the m number of optical splitters (m is a positive integer more than two), the optical switch circuit may be configured as a two dimensional planar matrix circuit having (m×n) crosspoints on which said optical switch means are arranged, the m number of optical splitters being connected to one surface of said planar matrix circuit, the waveguide means being connected to the other surface thereof.

The electrooptic means may be operative to emit light signals having wavelengths different from each other to the optical splitters.

The optical combiner may comprise a lens for allowing optical signals from the electrooptic means to be in parallel with each other, and an interference filter for optically combining the optical signals directed in parallel by the lens. The optical combiner may include an optical grating.

BRIEF DESCRIPTION OF THE DRAWINGS

The features and advantages of an optical switch circuit according to the present invention will become more apparent from the following description taken in conjunction with the accompanying drawings, in which:

FIG. 7 is a schematic view illustrating a third embodiment of an optical switch circuit according to the present invention;

Description of Preferred Embodiments

Figure 2:
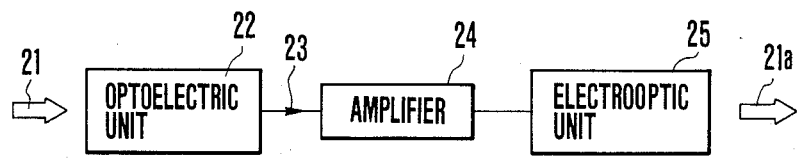
FIG. 2 is a block diagram illustrating an elementary circuit configuration of an optical gate switch employed in the present invention.

The present invention has solved problems encountered with the prior arts by adopting the above-mentioned configuration. FIG. 2 is a block diagram illustrating an elementrary circuit configuration of a switch (optical gate switch) employed in the present invention, which has a function allowing light to pass therethrough in on-state and allowing it to block thereat in off-state.

An incident light signal 21 is converted into an electric signal 23 including an information signal by an optoelectric means 22. The electric signal 23 passes through a suitable waveform shaper and amplifier circuit 24 and then is outputted as a light signal 21a for a second time by an electrooptic means 25.

In the following description, the optoelectric means is defined as an optoelectric or optoelectronic circuit element or device functioning as an optical-to-electric signal converter, which will be called an O/E converter hereinafter for the brevity of the description. Likewise, the electrooptic means is defined as an electrooptic circuit element or device functioning as an electric-to-optical signal converter, which will be called an E/O converter hereinafter for the same reason. By way of example, the O/E converter means may be constituted by a light receiving element e.g. a photodiode (PD), and the E/O converter means may be constituted by a light emitting element e.g. a semiconductor laser diode (LD), a light emitting diode (LED), combination of a light emitting element and an external light modulator. By varying the operating condition of the O/E and E/O converter means 22 and 25 and the waveform shaper/amplifier circuit 24 thus configured, the on/off switching of a light signal can be realized. Actually, switching can be realized by effecting on/off operation of a reverse bias with respect to PD or on/off operation of a forward bias with respect to LD or LED, or by effecting on/off operation of a bias for an electric element interconnected between O/E and E/O converter means.

With such a configuration, the O/E and E/O converter means can be controlled in an independent manner, thus enabling the extinction ratio in the on/off operation to be extremely large. Further, the optical switch circuit thus configured makes it possible to amplify a signal waveform by the intermediate electric circuit and to effect switching independent of the mode and the wavelength of the incident light. Such an optical gate switch can be also integrated on a single substrate by using material e.g. GaAlAs/GaAs, or InGaAsP/InP etc. Accordingly, by employing the optical gate switch thus configured, even when applied to an optical splitter-optical gate switch circuit, it is possible to realize an optical switch for multichannel which is small-sized and is suitable for integration, which has small crosstalk and can effect high speed switching without distortion of a broadband signal, and which has a wide adaptability such that light transmitted through multi-mode fiber can be switched.

First embodiment

Figure 3:
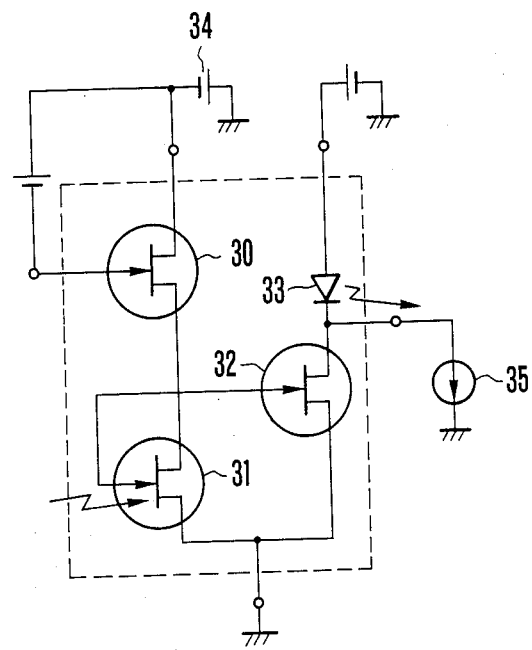
FIG. 3 is a circuit diagram illustrating a first embodiment of an optical gate switch configured as an optical repeater employed in the first embodiment shown in FIG. 1.
Figure 4:
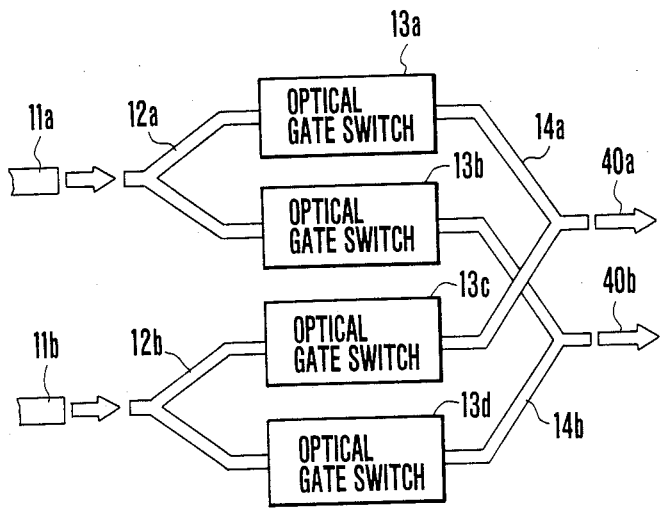
FIG. 4 is a schematic view illustrating a conventional optical switch circuit of optical splitter-optical gate type.

FIG. 3 is a circuit arrangement illustrating an embodiment of an optical gate switch employed in the present invention. This embodiment is constituted essentially by making use of the configuration of an optical repeater described in detail in the paper "A monolithically integrated optical repeater" M. Yust et al, Applied Physics Letters, vol. 35. No. 10, pp 795 to 797, 1979. In the reference material, there is described the trial fabrication result of a device in which all circuit elements within a dotted line in FIG. 3 are intergrated on a GaAs substrate by using material of GaAlAs/GaAs system.

The optical gate switch in FIG. 3 comprises three metal semiconductor FETs (MESFETs) of GaAs designated at 30, 31 and 32, and a laser diode (LD) 33. The FET 31 serves as a light-sensitive detector for detecting a light incident to the gate of the switch, the FET 32 a driver for the LD 33 and the FET 30 a transistor serving as an active load. When there is no light incident to the gate of the FET 31, a bias voltage given by a power source 34 is substantially applied to the gate of the FET 32, thus placing the FET 32 in cut off. A current source 35 is provided for giving a dc bias for the LD 33. Assuming that the LD 33 is biased in the vicinity of the threshold level by the current source 35, only dc bias current flows into the LD 33 when there is no incident light, with the result that oscillation does not occur. In contrast, when light is incident to the gate of the FET 31, photo excited carriers occur, allowing the operating conditions of the FETs 30 and 31 to be varied. As a result, a forward voltage change occurs at the gate of the FET 32 whereby it is turned on. Thus, a current corresponding to the incident optical signal flows through the LD 33, thereby to reproduce the incident optical signal.

The operation of the optical repeater can be stopped by interrupting each bias. Accordingly, this system may be used in effect as an optical gate switch. In addition, in the trial fabrication example, the device can be quite small-sized to such an extent that its dimension is 0.5×1.5 mm. It is here noted that an example of the monolithically integrated switch has been exhibited as the embodiment of the optical gate switch, but it is needless to say that the optical gate switch may be fabricated by the combination of ordinary discrete elements. However, with the future in mind, it is preferable that the entire elements are integrated on a single substrate as in the present embodiment. In the above-mentioned embodiment, the MESFET is employed as a light receiving element, the LD as a light emitting element, and the MESFET as the electrically active element. In addition to these elements, it is possible to use in combination any ordinary elements such as a PD, avalanche photodiode (ATD), phototransistor, LED or bipolar transistor etc. In the case of this embodiment, the on/off operation of the repeater may be performed by allowing the bias power source 34 or the current source 35 for supplying a bias current to the LD 33 to be subject to on/off operation. That is, the on/off operation of the repeater can be realized by changing the bias voltage or current in accordance with a control signal.

In regard to other systems for realizing on/off operation of the repeater, there are a method of switching a bias voltage for PD or APD when using it as a light receiving element, a method of effecting on/off operation of respective interstages between the O/E converter and the amplifier and between the amplifier and the E/O converter by making use of a gate switch of FET type, or a method of effecting on/off operation of a bias voltage or a signal for a light emitting element etc. It is possible to employ a desired one method among the above-mentioned methods or a method obtained by selectively combining desired ones.

Figure 1:
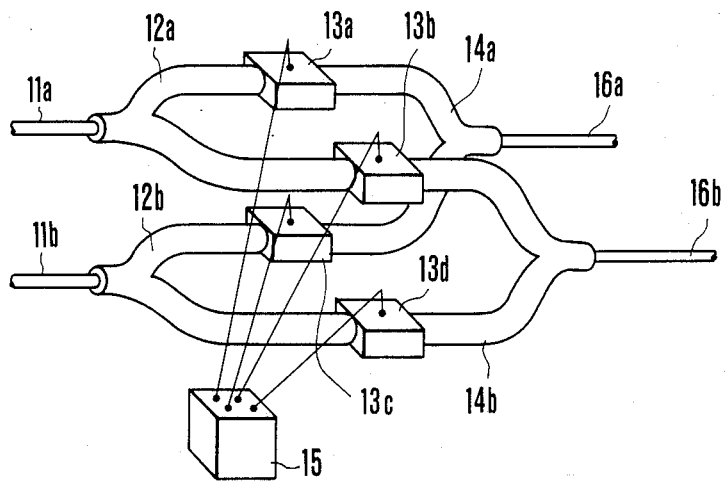
FIG. 1 is a schematic view illustrating a first embodiment of an optical switch circuit according to the present invention.

A preferred embodiment of an optical splitter-optical gate type switch circuit using the optical gate switch thus configured will be described. FIG. 1 is a schematic view illustrating a first embodiment of the optical switch circuit according to the present invention wherein the optical switch circuit having two-input and two-output is also referred to for the brevity of the explanation. Light signals transmitted via input light transmission channels 11a and 11b are optically coupled to fiber-fused star-couplers 12a and 12b serving as light splitters, respectively. Each light signal is split into two light signals by each star-coupler. That is, input light signals are split into four light signals in total. The two light signals split by the star-coupler 12a are inputted to optical gate switches 13a and 13b, respectively, and the two light signals split by the star-coupler 12b are inputted to optical gate switches 13c and 13d, respectively. The gate switches 13a, 13b, 13c and 13d are constituted by the repeater systems as previously described. Each gate switch is connected to a switch control unit 15, thus being subject to a control such that it is switched to a desired on/off state. The switch control unit 15 may be configured so as to allow a bias voltage for each element in the repeater to be changed in accordance with a control signal, and to produce a signal for opening or closing the gate of the FET gate switch, although the configuration of the switch control unit 15 is somewhat different depending upon which method is employed among the methods for realizing on/off operation of the repeater. By way of example, the switch control unit 15 may be comprised of a multichannel logic circuit.

In addition, when a light controllable element such as, for example, an optical gate FET is employed as an element for an on/off function control of the repeater, the switch control unit 15 can be constituted in combination by the above-mentioned logic circuit and the E/O converter (comprising in combination a drive circuit and a light emitting element), thus making it possible to transmit a control signal in the form of light by means of an optical fiber. In this instance, problems due to interference between the control signal and an electric signal in the repeater can be perfectly eliminated.

An optical combiner 14a is connected to the respective outputs of the optical gate switches 13a and 13c. Likewise, an optical combiner 14b is connected to the respective outputs of the optical gate switches 13b and 13d. The outputs of the light combiners 14a and 14b are connected to output transmission channels 16a and 16b, respectively.

The optical switch circuit shown in FIG. 1 is elementarily the same configuration as that of the previously described optical splitter-optical gate type switch circuit, leading to the possibility that the switch is small-sized and multichannel is realized. Further, since the repeater system capable of providing a large extinction ratio is used as each of the optical gate switches 13a, 13b, 13c and 13d, it is possible to realize small crosstalk and to amplify signals without taking into account the nature of incident light. Meanwhile, since the above-mentioned switch circuit is configured such that a light signal is converted once into an electric signal, there is a possibility that limited transmission bandwidth or occurrence of distortion may be caused as compared to the case where switching is effected with the entire signals being in the form of light signals. However, because the light signal is transmitted as the electric signal only within the repeater, an optical gate switch having small distortion over a broadband width can be realtively easily realized. Accordingly, the influence of crosstalk due to electrostatic coupling or electromagnetic induction is extremely smaller than that in the case where the light signal passes through a matrix switching circuit with it being in the form of the electric signal. For this reason, the switch circuit of this embodiment is applicable not only to the switching of high speed digital signal, but also to the switching of broadband analog signal.

Second embodiment

Figure 5:
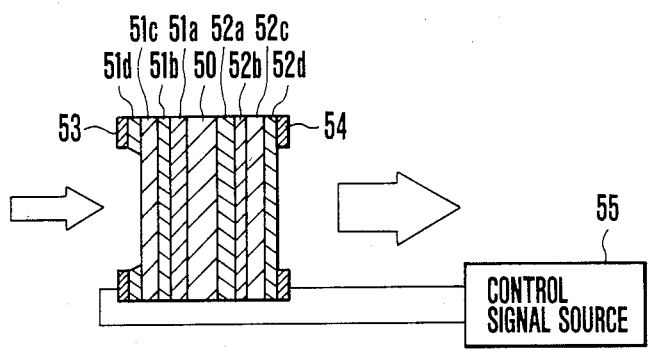
FIG. 5 is an explanatory view showing an optical switch configured as an optical gate switch array employed in a second embodiment of an optical switch according to the present invention.

In the above-mentioned first embodiment, the ordinary LD was used as a light emitting element in the repeater, but the present invention is not limited to this embodiment. The second embodiment is characterized in that a bifacial sensitive area type optical gate switch array is realized by making use of a device configured so that both side surfaces are used as light-receiving and light-emitting areas, respectively. FIG. 5 is an explanatory view showing an embodiment of one component of such an optical gate switch array. A collector layer 51a of $n^-$-GaAs, a base layer 51b of P-GaAs, an emitter layer 51c of $n^-$-GaAlAs and a layer 51d of $n^+$-GaAs are grown on one surface of a substrate 50 of $n^+$-GaAs to form a phototransistor as a light receiving element. Further, a cladding layer 52a of n-GaAlAs, an active layer 52b of $n^-$-GaAlAs, a cladding layer 52c of P-GaAlAs and a layer 52d of $P\pm$GaAs are grown on the other surface of the substrate 50 of $n^+$-GaAs to form a light emitting diode as a light emitting element. In addition, electrodes 53 and 54 for biasing are provided on both surface of the substrate 50, respectively. Such a gate switch array having a light receiving element formed on one side and a light emitting element formed on the other surface is described in IEEE TRANSACTIONS ON ELECTRON DEVICES vol. ED-28 (1983), 404.

In the above-mentioned material, a single unit obtained by combining the phototransistor with the light emitting diode is used as a unitary light amplifier. In order to use it as a unitary optical gate switch, it is sufficient to further provide a control signal source 55 for bias switching. The above-mentioned device is configured so that light-receiving and light-emitting areas are formed on both surfaces of a single substrate, respectively. Accordingly, an optical matrix switch circuit can be constituted by integrating a large number of these light-receiving and light-emitting areas on both surfaces of a single substrate in a matrix manner, respectively.

Figure 6:
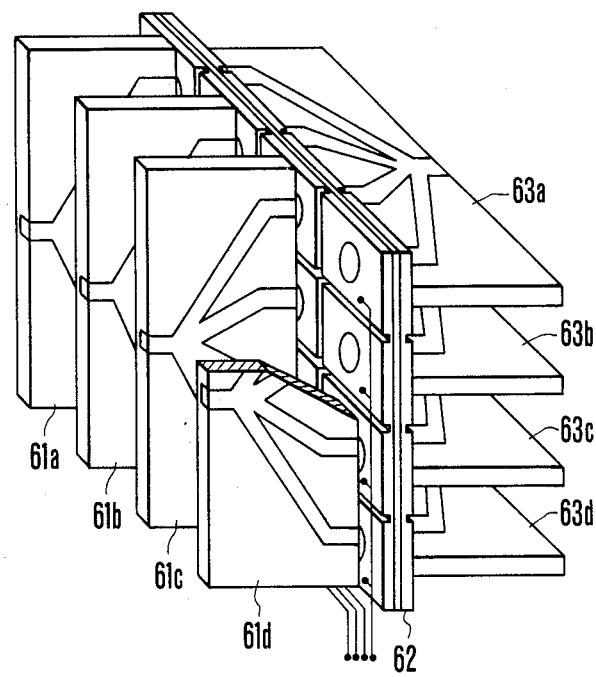
FIG. 6 is a perspective view illustrating the second embodiment of the optical switch circuit using the optical switch shown in FIG. 5.

FIG. 6 is a perspective view illustrating an embodiment of a (4×4) optical splitter-optical gate type optical switch circuit according to the present invention. The optical switch circuit of this embodiment comprises planar type optical splitters 61a, 61b, 61c and 61d each constituted by a guide of $SiO_2$ system with a $SiO_2$ film on a Si substrate being as a cladding layer, an optical gate switch array 62 (comprising 16 optical gate switches) formed by integrateing in a matrix manner phototransistors as light receiving elements on one surface of the above-mentioned substrate designated at 60 and light emitting diodes as light emitting elements on the other surface thereof, respectively, and optical combiners 63a, 63b, 63c and 63d for outputs, each of which is constituted so that an optical splitter similar to the above is arranged in an opposite direction wherein the setting is made such that pitches between each waveguide path and the light-receiving and light-emitting elements are equal to each other. An input light signal to each optical splitter is split and then is inputted to each optical gate switch. An arbitrary switching condition can be selected depending upon on/off state of each optical gate switch. Thus, a signal corresponding to the selected switching condition is derived as an output light signal via the corresponding output waveguide path. In this embodiment, as previously described, the unit optical gate switch is configured as bifacial sensitive area type device in a manner that the phototransistor as a light-receiving element and the LED as a light-emitting diode are formed on both surfaces of the substrate, respectively. Accordingly, when the optical switch circuit is configured by using a plurality of such unit devices, light-receiving and light-emitting areas will be arranged in a matrix manner on both surfaces of the substrate, respectively, as shown in FIG. 6. Thus, this allows one surface to serve as light-receiving area and the other surface to serve as light-emitting area. In this arrangement, optical splitters to which input light signals are transmitted and the output wave guide paths are optically connected to the light-receiving and the light-emitting areas, respectively, thus making it possible to effectively avoid complicated optical wiring becomes complicated. It is also obvious complicated multichannel configuration can be easily implemented.

Third embodiment

FIG. 7 is a schematic view illustrating a third embodiment of an optical switch circuit according to the present invention. An optical transmission system having for use in 1 micron band is now assumed and a two-input, two output optical switch circuit will be described. Light signals transmitted via input optical transmission channels 11a and 11b are split by optical splitters 12a and 12b each comprised of a fiber-used coupler and then the split light signals are incident to O/E converter means 22a, 22b, 22c and 22d, each comprising an InGaAs/InP photodiode and an FET preamplifier, respectively. Electric signals outputted from the O/E converter means 22a, 22b, 22c and 22d are amplified by amplifiers 24a, 24b, 24c and 24d, respectively, to allow E/O converter means 25a, 25b, 25c and 25d each comprising a driver circuit and an InGaAsP/InP semiconductor laser diode (LD) to be operative. The InGaAsP/InP LD assembled in each E/O converter means is operative to produce an oscillation wavelength variable over a range from 1.2 to 1.55 micron by adjusting the composition ratio of InGaAsP. In this embodiment, the setting is made such that each wavelength of the E/O converter means 25a and 25c is approximately 1.2 micron and each wavelength of the E/O converter means 25b and 25d is approximately 1.3 micron.

Output light signals from the E/O converter means 25a, 25b, 25c and 25d are collimated by lenses 71a, 71b, 71c and 71d, respectively. The output light signals thus collimated are optically combined by interference filters 72a and 72b with their optical axes being coincident with each other by making use of the difference between wavelengths. The combined two light beams are optically coupled to output optical transmission channels 16a and 16b with high efficiency by means of lenses 73a and 73b, respectively. In this embodiment, the switching operation required for the optical switch circuit is performed by allowing the control unit 15 to be operative so as to provide, in accordance with a preselected switching condition, a gate signal to each of the FET gate switches provided in interstages of the amplifiers 24a, 24b, 24c and 24d and a bias voltage to the LDs of the E/O converter means 25a, 25b, 25c and 25d.

In general, when an attempt is made to realize optical combination of light by using only an optical splitter having one input and n outputs with its input/output relationship being opposite to that in the normal use, perfect mode-match cannot be obtained between a large number of light signals to be combined and single waveguide path coupled to the output of the oppositely arranged optical splitter, thereby causing large losses. In contrast, the configuration as in this embodiment makes it possible to extremely reduce a loss produced when optically combining output light from the E/O converter means 25a, 25b, 25c and 25d. Accordingly, this ensures a high margin in reagard to the loss of the overall optical transmission system, giving rise to increase in transmission distance and improvement in reliability. In the above-mentioned embodiment, the interference filter was used as means for optically combining light by making use of the difference between wavelengths. However, the present invention is not limited to this embodiment. For example, when the optical splitter is configured by utilizing an optical grating, it is possible to optically combine light having wavelengths which are closer to each other because of high resolution of the wavelength. This is advantageous in implementation of a multichannel optical switch circuit. Further, when there is employed, as an optical splitter, a waveguide type wavelength multiplexer of a structure such that a grating is formed on a waveguide path, it is possible to make the device small-sized and realize integrated configuration. In addition, when there is used a waveguide type wavelength multiplexer of InGaAsP/InP system, it is possible to monolithically integrate it with each LD of the E/O converter means 25a, 25b, 25c and 25d.

Fourth embodiment

Figure 8:
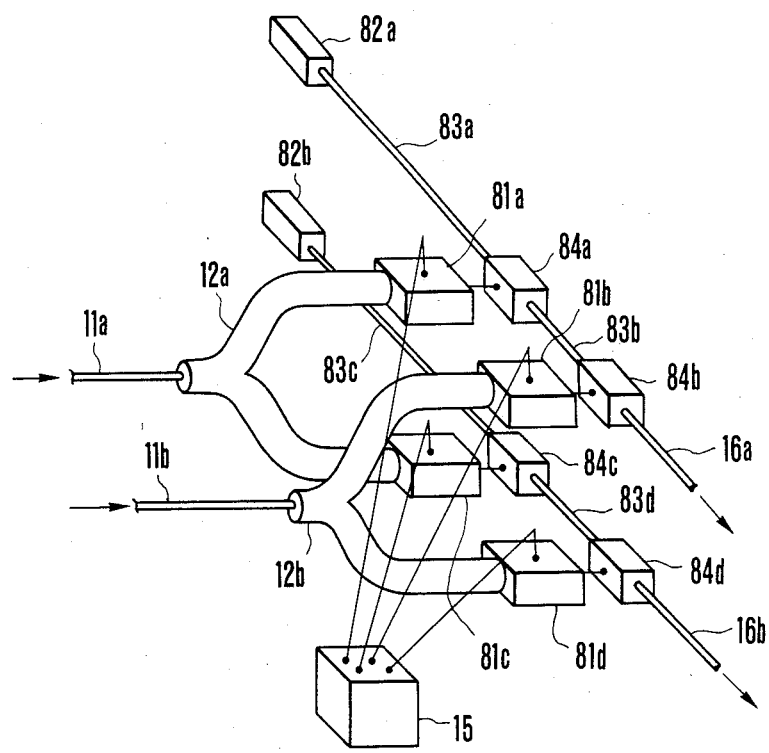
FIG. 8 is a schematic view illustrating a fourth embodiment of an optical switch circuit according to the present invention.

FIG. 8 is a perspective view illustrating a fourth embodiment according to the present invention wherein an example of a two-input, two-output optical switch is also shown for the brevity of the description. Light signals transmitted via input optical trasnmission channels 11a and 11b are coupled to star-couplers 12d and 12b serving as optical splitters, repectively. Each light signal thus coupled is split into two light signals. That is, input light signals are split into four light signals in total. Two light signals transmitted via the star-coupler 12a are inputted to optoelectronic gates 81a and 81c and two light signals transmitted via the star-coupler 12b are inputted to optoelectronic gates 81b and 81d. Each optoelectronic gate is configured as a module comprising an O/E converter and an amplifier stage as described later. These optoelectronic gates 81a, 81b, 81c and 81d are connected to the switch control unit 15 so that a desired on/off switching condition can be realized. A dc light signal supplied from a dc light source 82a is inputted to a light modulator 84a to which an output electric signal outputted from the optoelectronic gate 81a is applied through an optical waveguide path 83a. The output light of the light modulator 84a passes through an optical waveguide path 83b and an optical modulator 84b to which an electric signal outputted from the optoelectronic gate 81b is applied, and then is transmitted to the output optical transmission path 16a. Likewise, a dc light signal supplied from a dc light source 82b is inputted to an optical modulator 84c to which an electric signal outputted from the optoelectronic gate 81c is applied through an optical wavepath 83c. The output light of a light modulator 84c passes through an optical waveguide path 83d and a light modulator 84d to which an electric signal outputted from the optoelectronic gate 81d is applied, and then is transmitted to the output transmission path 16b.

Figure 9:
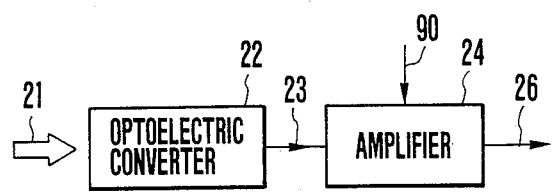
FIG. 9 is a block diagram illustrating an electrical configuration of an optical gate switch used in the optical switch circuit shown in FIG. 8.

FIG. 9 is a block diagram illustrating the circuit configuration of the optoelectronic gates 81a, 81b, 81c and 81d shown in FIG. 8. An incident light signal 21 is converted into an electric signal 23 by an O/E converter means 22. The electric signal 23 is outputted as a modulation signal 26 via a suitable amplifier circuit 24. At this time, the modulation signal 26 changes to either a dc signal or a signal obtained by amplifying the electric signal 23 in accordance with a control signal 90 supplied from the switch control unit 15.

Figure 10:
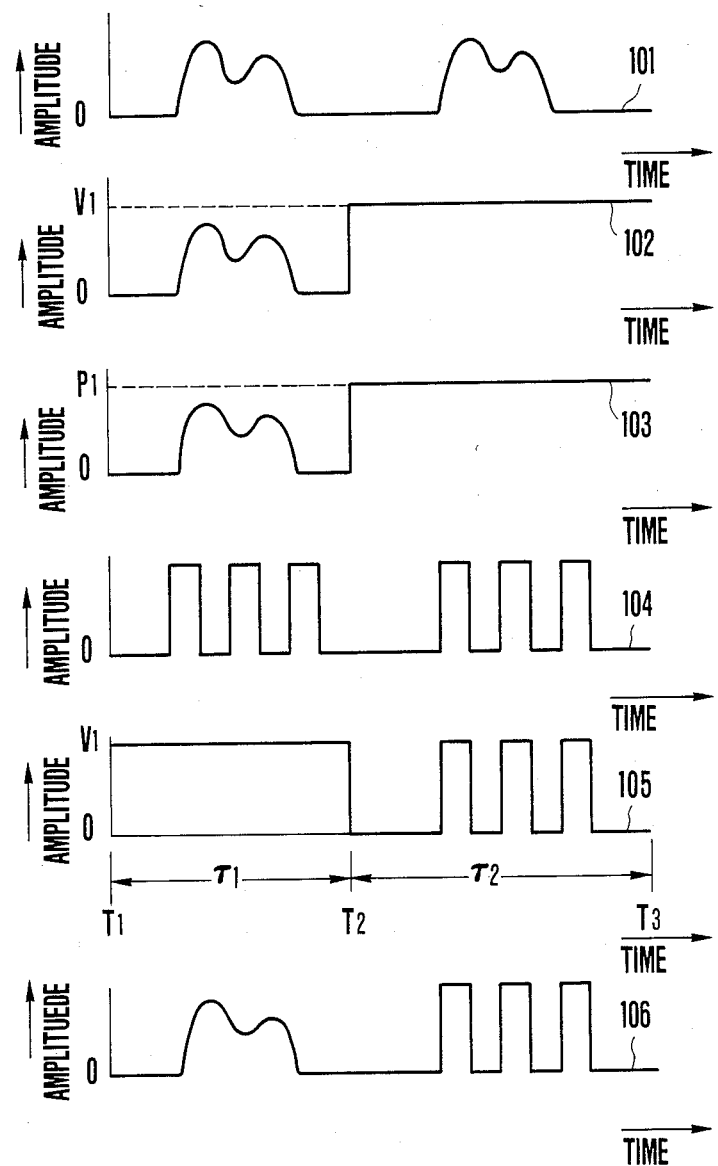
FIG. 10 is a timing chart showing the operation of the optical switch circuit shown in FIG. 8.

FIG. 10 is a timing chart for explaining the operation of the embodiment shown in FIG. 8. In this figure, reference numerals 101 and 104 denote an input light signal to the input optical transmission path 11a (FIG. 8) and an input light signal to the input optical transmission path 11b (FIG. 8), respectively. In this mode of operation, the switching is effected in a manner that the light signal 101 is outputted to the output optical transmission path 16a during a period from time $T_1$ to $T_2$ (time period $\tau_1$) and the light signal 104 is outputted thereto during a period from time $T_2$ to $T_3$ (time period $\tau_2$). As indicated by reference numeral 102, the optoelectronic gate 81a is operative during the time period $\tau_1$ so as to output a modulation signal obtained by optoelectronic-converting and amplifying the light signal 101, and is operative during the time period $\tau_2$ so as to output a modulation signal of a constant voltage $V_1$. With the modulation signal 102 of such a nature, a dc light input from the dc light source 82a to the optical modulator 84a via the optical waveguide path 83a is modulated. Accordingly, as indicated by reference numeral 103, a light signal outputted from the light modulator 84a to the optical waveguide path 83b has a waveform similar to that of the modulation signal 102, i.e., it has the same waveform as that of the light signal 101 during the time period $\tau_1$ and becomes a dc light of a constant level $P_1$ during the time period $\tau_2$.

On the other hand, as indicated by reference numeral 105, the optoelectronic gate 81b is operative during the time period $\tau_1$ so as to output a modulation signal of a constant voltage $V_1$, and is operative during the time period $\tau_2$ so as to output a modulation signal obtained by optoelectronic-converting and amplifying the light signal 104. With the modulation signal 105, a light signal 103 inputted to the light modulator 84b via the optical waveguide path 83b is modulated. As a result, as indicated by reference numeral 106, a light signal outputted from the light modulator 84b to the output optical transmission path 16a has a waveform similar to that of the light signal 101 during the time period $\tau_1$ and has a waveform similar to that of the light signal 104.

In order not to output any light signal to the output optical transmission paths 16a and 16b, it is sufficient to allow a modulation signal for each optoelectronic gate to be zero or to stop the operation of the dc light sources 82a and 82b.

Figure 11:
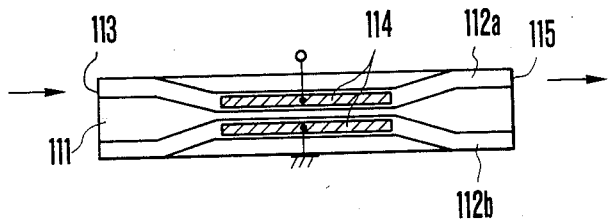
FIG. 11 is a schematic view illustrating one example of a light modulator used in the optical switch circuit shown in FIG. 8.

FIG. 11 is a schematic view illustrating a first example of the light modulators 84a, 84b, 84c and 84d in the embodiment shown in FIG. 8. Optical waveguide paths 112a and 112b are formed close to each other on a crystalline substrate 111 having electro-optical effect so that they are operable as a directional coupler. A light signal incident on one end surface 113 of the optical waveguide path 112a is modulated by a modulation signal applied between electrodes 114, and then is outputted from the other end surface 115. With such a light modulator operative based on the electro-optical effect, a small optical loss is expected. Further, optical modulator array can be formed by integrating a plurality of such light modulators on one crystalline substrate. The light modulator having such an electro-optical effect is described in detail in IEEE TRANSACTIONS ON Microwave Theory and Techniques, Vol. 1, MIT-30, No. 8, August, 1982.

Figure 12:
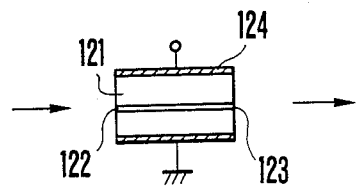
FIG. 12 is a schematic view illustrating another example of a light modulator used in the optical switch circuit shown in FIG. 8.

FIG. 12 is a schematic view illustrating a second example of the light modulators 84a, 84b, 84c and 84d employed in the embodiment shown in FIG. 8. A light signal inputted to one end surface of an active layer of a semiconductor laser 121 is modulated by a modulation signal applied to an electrode 124. The light signal thus modulated is outputted from the other end surface 123 of the active layer. Such a light modulator using a semiconductor laser can provide optical amplification. The light modulator using such a semiconductor laser is described in the article of IEEE Journal of Quantum Electron vol. QE-19, p. 157, 1983.

In the embodiment shown in FIG. 8, it is possible to replace the light modulators 84a and 84c with a modulatable light emitting element (semiconductor laser) except for the dc light source 82a and 82b and the optical waveguide paths 83a and 83c, thus making it possible to reduce the number of the light modulator by the number of output channels.

As described in detail, the present invention can provide an optical switch circuit which is small-sized and is suitable for integration, which is of a small crosstalk thereby being able to effect a high speed switching without distortion of a broadband signal, and which has a wide application such that light transmitted through a multimode optical fiber can be switched, thus significantly contributing to the realization of various kinds of optical systems in future.

What is claimed is:

1. An optical switch circuit configured as a matrix having (m×n) crosspoints where m denotes the number of input optical channels and n denotes the number of output optical channels (m and n being a positive integer), wherein when the coordinates of an arbitrary crosspoint are expressed as (i, j) (i=1, 2, ... m and j=1, 2, ... n), there are arranged on the (m×n) crosspoints,
   (a) optoelectric means for converting an input light signal transmitted via each of said input optical channels into an electric signal,
   (b) electric circuit means responsive to a control signal to output an electric signal corresponding to an output electric signal from said optoelectric means, and
   (c) light modulating means responsive to said electric signal from said electric circuit means to produce a modulated light signal, and wherein the optical switch circuit comprises:
   (i) first means for distributing each of the m number of input light signals into the n number of optoelectric means defined by fixing the i-component of said coordinates of the arbitrary crosspoint, and
   (ii) second means for optically combining each of light outputs from the m number of light modulating means defined by fixing the j-component of said coordinates of the arbitrary crosspoint.

2. An optical switch circuit as set forth in claim 1, wherein said first means is comprised of an optical light splitter and said second means is comprised of an optical light combiner.

3. An optical switch circuit as set forth in claim 1, wherein said light modulating means functions as an electrooptic means.

4. An optical switch circuit as set forth in claim 1, wherein said optoelectric means, said electric circuit means and said light modulating means constitute an optical gate switch.

5. An optical switch circuit as set forth in claim 4, wherein said optical gate switch comprises a light-sensitive detector for detecting a light signal, a driver element coupled to said light-sensitive detector, and electrooptic means driven by said driver element.

6. An optical switch circuit as set forth in claim 5, wherein each of said light-sensitive detector and said driver element is comprised of a metal semiconductor field-effect transistor and said electrooptic means is comprised of a laser diode.

7. An optical switch circuit as set forth in claim 4, wherein said optical gate switch comprises in combination a photodiode, an avalanche photodiode, a phototransistor, a light emitting diode, and a bipolar transistor etc.

8. An optical switch circuit comprising in combination,
  (a) an m number of optical splitters (m is a positive integer) for splitting a light signal entering from one input terminal into an n number of light signals (n is an integer more than two),
  (b) optical switch means optically cascade-connected to each output of said m number of optical splitters, said optical switch means comprising optoelectric means for converting said split light signals into electric signals, and electrooptic means for converting said electric signals into optical signals, and switch control means operative to effect a switch control for said optoelectric means and said electrooptic means, thus presenting a function to allow said split light signals from said m number of optical splitters to pass through said optical switch means in on-state and to prevent them from passing in off-state, and
  (c) waveguide means cascade-connected to each of said optical switch means to allow said optical signals from said optical switch means to be outputted therefrom.

9. An optical switch circuit as set forth in claim 8, wherein when said optical switch circuit is provided with the m number of optical splitters (m is a positive integer more than two), said optical switch circuit is configured as a two dimentional planar matrix circuit having (m×n) crosspoints on which said optical switch means are arranged, said m number of optical splitters being connected to one surface of said planar matrix circuit, said waveguide means being connected to the other surface thereof.

10. An optical switch circuit as set forth in claim 9, wherein said matrix circuit comprises a phototransistor serving as a light receiving element comprising a collector layer, a base layer, and an emitter layer which are stacked on one surface of a substrate, and a light emitting diode serving as a light emitting element comprising a first cladding layer, an active layer, and a second cladding layer which are stacked on the other surface of said substrate, electrodes provided on the tops of said phototransistor and said photodiode, respectively, and a control signal source connected to said respective electrodes for switching a bias.

11. An optical switch circuit as set forth in claim 10, wherein in said phototransistor, said collector layer is made of $n^-$-GaAs, said base layer is made of P-GaAs, said emitter layer is made of $n^-$-GaAlAs, and in said photodiode, said first cladding layer is made of n-GaAlAs, said active layer is made of $n^-$-GaAlAs and said second cladding layer is made of P-GaAlAs.

12. An optical switch circuit as set forth in claim 8, wherein said electrooptic means is operative to emit light signals having wavelengths different from each other to said optical splitters.

13. An optical switch circuit as set forth in claim 12, wherein said waveguide means is configured as optical combiner means comprising a set of lenses for allowing optical signals from said electrooptic converters, and an interference film filter for optically combining said optical signals directed in parallel by said set of lenses.

14. An optical switch circuit as set forth in claim 12, wherein said waveguide means is configured as optical combiner means including an optical grating.

15. An optical switch circuit as set forth in claim 12, wherein said waveguide means is configured as optical combiner means comprising a waveguide type multiplexer in which an optical grating is formed on a waveguide path.

16. An optical switch circuit as set forth in claim 15, wherein when said waveguide type multiplexer employs InGaAsP/InP system as a constituent material, said waveguide type multiplexer of InGaAsP/InP system and said laser diode of said optoelectric means are monolithically integrated.

17. An optical switch circuit comprising:
  m (positive integer) input optical channels;
  m optical splitter means each of which is connected with each of said input optical channels for splitting an input light signal into n (positive integer) branch light signals;
  m×n optical gate switch means arranged to form a matrix of m rows and n columns, input terminals of said optical gate switch means belonging to the same row of said matrix being connected to the same input optical channel through said corresponding optical splitter means, respectively;
  n optical combiner means each of which is connected with output terminals of said optical gate switch means belonging to the same column of said matrix for combining light signals therefrom and outputting a modulated light signal to each of n output optical channels, respectively;
  each of said optical gate switch means comprising;
  optoelectric means for converting the input light signal transmitted through said corresponding input optical channel into an electric signal,
  electric circuit means responsive to a control signal to output an electric signal corresponding to the electric signal outputted from said optoelectric means; and
  electrooptic means responsive to said electric signal outputted from said electric circuit means to producing said modulated light signal.

* * * * *